US009009561B2

(12) United States Patent
Pereira et al.

(10) Patent No.: US 9,009,561 B2
(45) Date of Patent: Apr. 14, 2015

(54) SYSTEM AND METHOD FOR DETECTING ERRORS IN AUDIO DATA

(75) Inventors: Mark Pereira, Livermore, CA (US);
Ling Yang, Pleasanton, CA (US);
Govendra Gupta, Gandhi Nagar Jammu (IN)

(73) Assignee: NVIDIA Corporation, Santa Clara, CA (US)

( * ) Notice: Subject to any disclaimer, the term of this patent is extended or adjusted under 35 U.S.C. 154(b) by 171 days.

(21) Appl. No.: 13/564,586

(22) Filed: Aug. 1, 2012

(65) Prior Publication Data
US 2014/0040709 A1    Feb. 6, 2014

(51) Int. Cl.
| H03M 13/00 | (2006.01) |
| H03M 5/14 | (2006.01) |
| H03M 13/29 | (2006.01) |
| H03M 13/11 | (2006.01) |
| H03M 13/15 | (2006.01) |
| H03M 13/09 | (2006.01) |
| H03M 13/47 | (2006.01) |

(52) U.S. Cl.
CPC .......... *H03M 5/145* (2013.01); *H03M 13/2906* (2013.01); *H03M 13/1145* (2013.01); *H03M 13/15* (2013.01); *H03M 13/09* (2013.01); *H03M 13/098* (2013.01); *H03M 13/47* (2013.01)

(58) Field of Classification Search
CPC . H03M 5/145; H03M 13/1145; H03M 13/15; H03M 13/2906; H03M 13/3738; H03M 13/09; H03M 13/098; H03M 13/47
USPC .................................................. 714/755, 758
See application file for complete search history.

(56) References Cited

U.S. PATENT DOCUMENTS

| 5,886,999 | A | * | 3/1999 | Kojima et al. | ................ | 714/708 |
| 5,954,834 | A | * | 9/1999 | Hassan et al. | ................ | 714/758 |
| 6,513,139 | B2 | * | 1/2003 | Gray | .............. | 714/771 |
| 6,751,586 | B1 | * | 6/2004 | Okuno | .......... | 704/228 |
| 7,225,388 | B2 | * | 5/2007 | Ejima et al. | .................... | 714/762 |
| 7,243,296 | B2 | * | 7/2007 | Christensen | ................. | 714/800 |
| 7,372,378 | B2 | | 5/2008 | Sriram | | |
| 7,805,656 | B2 | * | 9/2010 | Jiang | ............. | 714/758 |
| 8,225,166 | B2 | * | 7/2012 | Yang et al. | .................... | 714/752 |
| 8,327,239 | B2 | * | 12/2012 | Yamasuge et al. | ............ | 714/784 |
| 8,352,841 | B2 | * | 1/2013 | Sun et al. | ...................... | 714/780 |
| 8,386,904 | B2 | * | 2/2013 | Lakkis | .......................... | 714/801 |
| 8,495,468 | B2 | * | 7/2013 | Dachiku | ...................... | 714/770 |
| 2014/0040709 | A1 | | 2/2014 | Pereira et al. | | |

OTHER PUBLICATIONS

Non-Final Office Action dated May 16, 2014 for U.S. Appl. No. 13/564,610, 19 pages.

* cited by examiner

*Primary Examiner* — James C Kerveros
(74) *Attorney, Agent, or Firm* — Artegis Law Group, LLP

(57) ABSTRACT

An application programming interface (API) executed by a first processing unit combines audio data samples with error code values generated for those samples. The API then causes a data stream to be opened having sufficient bandwidth to accommodate combined samples made up of audio data samples and corresponding error code values. The combined samples are then transmitted to a decoder and validation unit within a second processing unit that receives the combined data, strips the error code values and validates the audio data based on the error code values. When the error code values indicate that the audio data has been compromised, the second processing unit terminates the output of sound derived from the audio data.

20 Claims, 6 Drawing Sheets

SYSTEM AND METHOD FOR DETECTING ERRORS IN AUDIO DATA

BACKGROUND OF THE INVENTION

1. Field of the Invention

The present invention generally relates to audio hardware, and, more specifically, to a system and method for detecting errors in audio data.

2. Description of the Related Art

A conventional media player application, such as a Blu-Ray™ player application, streams audio data to hardware that processes the audio data and then causes speakers to output sound derived from that audio data. The hardware could be, for example, a graphics processing unit (GPU) that includes audio processing circuitry.

When the media player application streams the audio data to hardware, the data passes through an operating system (OS) layer to an audio driver. The audio driver is a software application executing within the OS layer that is capable of communicating directly with the hardware. When the audio data passes through the OS layer to the audio driver, that data may become modified, or even compromised, before reaching the audio hardware. For example, some OSs append invalid NULL values to the end of the audio data in order to fill a playback buffer, thereby introducing errors into that data. The audio data may also become compromised by random bit flips or other unpredictable data-altering events. Another instance of data becoming comprised occurs when the OS is heavily loaded and audio data is not written to a given location before audio hardware reads from that location, causing the hardware to fetch stale data.

Problems arise because conventional audio hardware may not be able to detect that the audio data has been compromised and may attempt to output sound derived from that audio data despite the data being compromised. Sound derived from compromised audio data may be full of noise and unintelligible or, worse yet, noisy and unpleasant to the ears of the user of the media player application. Providing an unpleasant user experience is unacceptable to providers of media player applications as well as to manufacturers of hardware that supports media players, such as GPU manufacturers.

Accordingly, what is needed in the art is a more effective technique for detecting errors in audio data.

SUMMARY OF THE INVENTION

One embodiment of the present invention sets forth a computer-implemented method for embedding error code values into data samples streamed from a first hardware unit to a second hardware unit, the method including receiving an M bit data sample from a software application executing on the first hardware unit, M being an integer, generating an N bit error code value by performing an error analysis on the M bit data sample, N being an integer, generating an M+N bit augmented data sample by combining the M bit data sample with the N bit error code value, and opening an M+N bit data stream to the second hardware unit, where the second hardware unit is configured to receive the M+N bit augmented data sample via the M+N bit data stream, reproduce the M bit data sample and the N bit error code value based on the M+N bit augmented data sample, and identify errors in the M bit data sample based on the N bit error code value.

An advantage of the techniques described herein is that, when audio hardware receives compromised audio data, the audio hardware is capable of determining that the audio data has been compromised and is able to stop outputting sound derived from the compromised audio data. Accordingly, the audio hardware preserves the user experience by ensuring that unintelligible or unpleasant sounds caused by compromised audio data are not output to the user.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
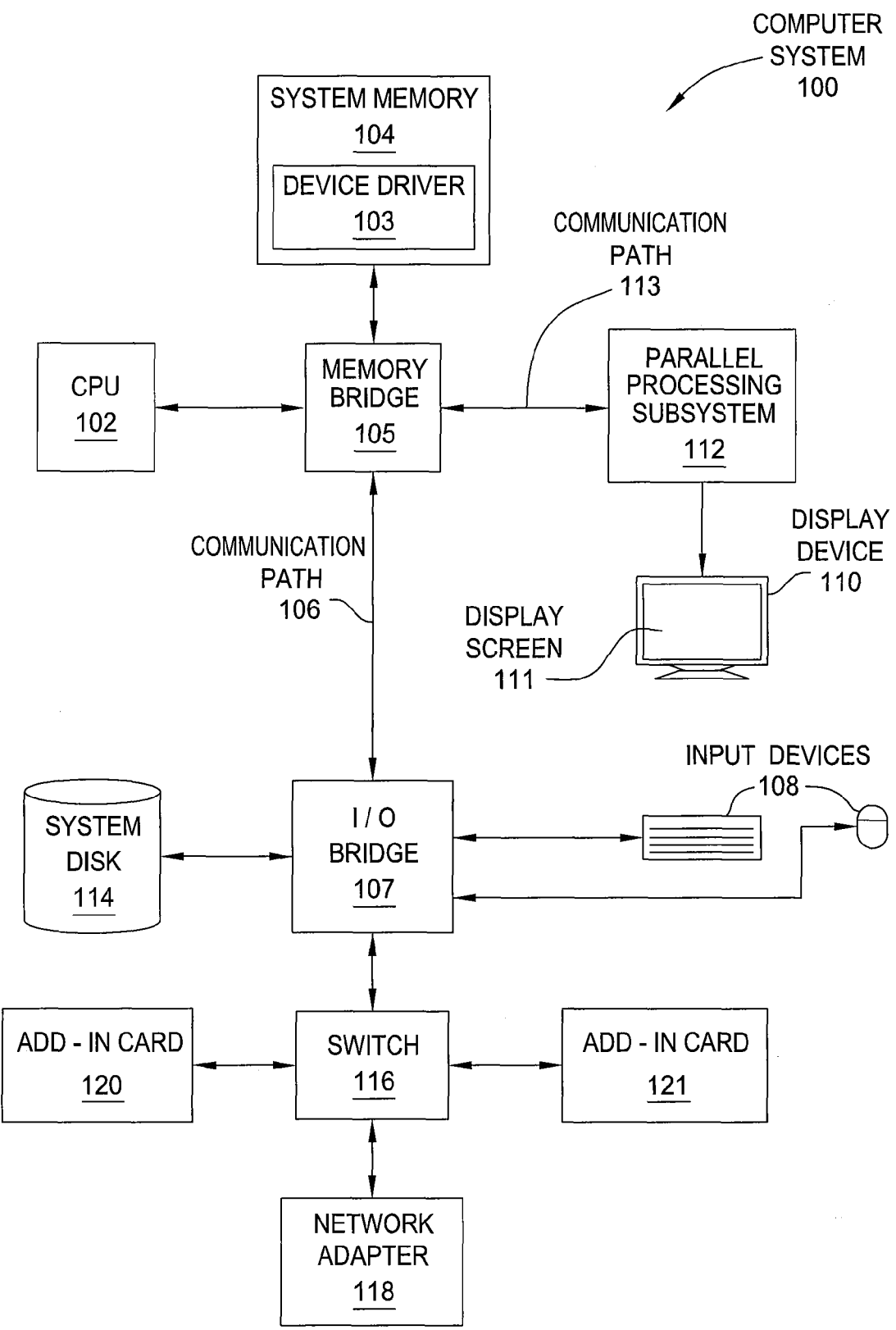
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 that includes a device driver 103. CPU 102 and system memory 104 communicate via an interconnection path that may include a memory bridge 105. Memory bridge 105, which may be, e.g., a Northbridge chip, is connected via a bus or other communication path 106 (e.g., a HyperTransport link) to an input/output (I/O) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a peripheral component interconnect (PCI) express, Accelerated Graphics Port (AGP), or HyperTransport link); in one embodiment parallel processing subsystem 112 is a graphics subsystem that delivers pixels to a display device 110 (e.g., a conventional cathode ray tube (CRT) or liquid crystal display (LCD) based monitor). A system disk 114 is also connected to I/O bridge 107. A switch 116 provides connections between I/O bridge 107 and other components such as a network adapter 118 and various add-in cards 120 and 121. Other components (not explicitly shown), including universal serial bus (USB) or other port connections, compact disc (CD) drives, digital video disc (DVD) drives, film recording devices, and the like, may also be connected to I/O bridge 107. Communication paths interconnecting the various components in FIG. 1 may be implemented using any suitable protocols, such as PCI, PCI Express (PCIe), AGP, HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. Large embodiments may include two or more CPUs 102 and two or more parallel processing systems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Figure 2:
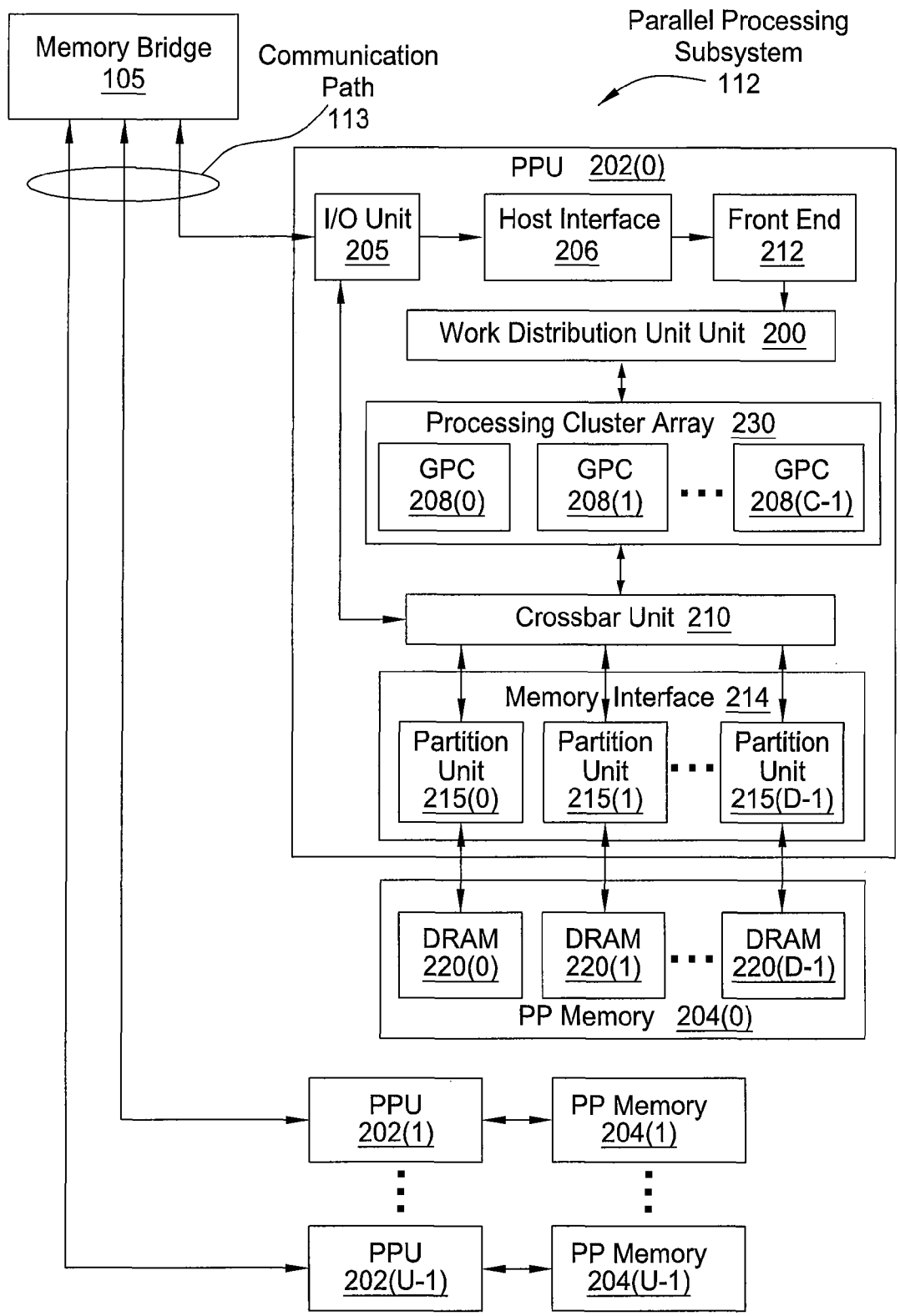
FIG. 2 is a block diagram of a parallel processing subsystem for the computer system of FIG. 1, according to one embodiment of the present invention.

FIG. 2 illustrates a parallel processing subsystem 112, according to one embodiment of the present invention. As shown, parallel processing subsystem 112 includes one or more parallel processing units (PPUs) 202, each of which is coupled to a local parallel processing (PP) memory 204. In general, a parallel processing subsystem includes a number U of PPUs, where U≥1. (Herein, multiple instances of like objects are denoted with reference numbers identifying the object and parenthetical numbers identifying the instance where needed.) PPUs 202 and parallel processing memories 204 may be implemented using one or more integrated circuit devices, such as programmable processors, application specific integrated circuits (ASICs), or memory devices, or in any other technically feasible fashion.

Referring again to FIG. 1, in some embodiments, some or all of PPUs 202 in parallel processing subsystem 112 are graphics processors with rendering pipelines that can be configured to perform various tasks related to generating pixel data from graphics data supplied by CPU 102 and/or system memory 104 via memory bridge 105 and bus 113, interacting with local parallel processing memory 204 (which can be used as graphics memory including, e.g., a conventional frame buffer) to store and update pixel data, delivering pixel data to display device 110, and the like. In some embodiments, parallel processing subsystem 112 may include one or more PPUs 202 that operate as graphics processors and one or more other PPUs 202 that are used for general-purpose computations. The PPUs may be identical or different, and each PPU may have its own dedicated parallel processing memory device(s) or no dedicated parallel processing memory device(s). One or more PPUs 202 may output data to display device 110 or each PPU 202 may output data to one or more display devices 110.

In operation, CPU 102 is the master processor of computer system 100, controlling and coordinating operations of other system components. In particular, CPU 102 issues commands that control the operation of PPUs 202. In some embodiments, CPU 102 writes a stream of commands for each PPU 202 to a pushbuffer (not explicitly shown in either FIG. 1 or FIG. 2) that may be located in system memory 104, parallel processing memory 204, or another storage location accessible to both CPU 102 and PPU 202. PPU 202 reads the command stream from the pushbuffer and then executes commands asynchronously relative to the operation of CPU 102.

Referring back now to FIG. 2, each PPU 202 includes an I/O unit 205 that communicates with the rest of computer system 100 via communication path 113, which connects to memory bridge 105 (or, in one alternative embodiment, directly to CPU 102). The connection of PPU 202 to the rest of computer system 100 may also be varied. In some embodiments, parallel processing subsystem 112 is implemented as an add-in card that can be inserted into an expansion slot of computer system 100. In other embodiments, a PPU 202 can be integrated on a single chip with a bus bridge, such as memory bridge 105 or I/O bridge 107. In still other embodiments, some or all elements of PPU 202 may be integrated on a single chip with CPU 102.

In one embodiment, communication path 113 is a PCIe link, in which dedicated lanes are allocated to each PPU 202, as is known in the art. Other communication paths may also be used. An I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to parallel processing memory 204) may be directed to a memory crossbar unit 210. Host interface 206 reads each pushbuffer and outputs the work specified by the pushbuffer to a front end 212.

Each PPU 202 advantageously implements a highly parallel processing architecture. As shown in detail, PPU 202(0) includes a processing cluster array 230 that includes a number C of general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. For example, in a graphics application, a first set of GPCs 208 may be allocated to perform tessellation operations and to produce primitive topologies for patches, and a second set of GPCs 208 may be allocated to perform tessellation shading to evaluate patch parameters for the primitive topologies and to determine vertex positions and other per-vertex attributes. The allocation of GPCs 208 may vary dependent on the workload arising for each type of program or computation.

GPCs 208 receive processing tasks to be executed via a work distribution unit 200, which receives commands defining processing tasks from front end unit 212. Processing tasks include indices of data to be processed, e.g., surface (patch) data, primitive data, vertex data, and/or pixel data, as well as state parameters and commands defining how the data is to be processed (e.g., what program is to be executed). Work distribution unit 200 may be configured to fetch the indices corresponding to the tasks, or work distribution unit 200 may receive the indices from front end 212. Front end 212 ensures that GPCs 208 are configured to a valid state before the processing specified by the pushbuffers is initiated.

When PPU 202 is used for graphics processing, for example, the processing workload for each patch is divided into approximately equal sized tasks to enable distribution of the tessellation processing to multiple GPCs 208. A work distribution unit 200 may be configured to produce tasks at a frequency capable of providing tasks to multiple GPCs 208 for processing. By contrast, in conventional systems, processing is typically performed by a single processing engine, while the other processing engines remain idle, waiting for the single processing engine to complete its tasks before beginning their processing tasks. In some embodiments of the present invention, portions of GPCs 208 are configured to perform different types of processing. For example a first portion may be configured to perform vertex shading and topology generation, a second portion may be configured to perform tessellation and geometry shading, and a third portion may be configured to perform pixel shading in screen space to produce a rendered image. Intermediate data produced by GPCs 208 may be stored in buffers to allow the intermediate data to be transmitted between GPCs 208 for further processing.

Memory interface 214 includes a number D of partition units 215 that are each directly coupled to a portion of parallel processing memory 204, where D≥1. As shown, the number of partition units 215 generally equals the number of DRAM 220. In other embodiments, the number of partition units 215 may not equal the number of memory devices. Persons skilled in the art will appreciate that dynamic random access memories (DRAMs) 220 may be replaced with other suitable storage devices and can be of generally conventional design. A detailed description is therefore omitted. Render targets, such as frame buffers or texture maps may be stored across DRAMs 220, allowing partition units 215 to write portions of each render target in parallel to efficiently use the available bandwidth of parallel processing memory 204.

Any one of GPCs 208 may process data to be written to any of the DRAMs 220 within parallel processing memory 204. Crossbar unit 210 is configured to route the output of each GPC 208 to the input of any partition unit 215 or to another GPC 208 for further processing. GPCs 208 communicate with memory interface 214 through crossbar unit 210 to read from or write to various external memory devices. In one embodiment, crossbar unit 210 has a connection to memory interface 214 to communicate with I/O unit 205, as well as a connection to local parallel processing memory 204, thereby enabling the processing cores within the different GPCs 208 to communicate with system memory 104 or other memory that is not local to PPU 202. In the embodiment shown in FIG. 2, crossbar unit 210 is directly connected with I/O unit 205. Crossbar unit 210 may use virtual channels to separate traffic streams between the GPCs 208 and partition units 215.

Again, GPCs 208 can be programmed to execute processing tasks relating to a wide variety of applications, including but not limited to, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel shader programs), and so on. PPUs 202 may transfer data from system memory 104 and/or local parallel processing memories 204 into internal (on-chip) memory, process the data, and write result data back to system memory 104 and/or local parallel processing memories 204, where such data can be accessed by other system components, including CPU 102 or another parallel processing subsystem 112.

A PPU 202 may be provided with any amount of local parallel processing memory 204, including no local memory, and may use local memory and system memory in any combination. For instance, a PPU 202 can be a graphics processor in a unified memory architecture (UMA) embodiment. In such embodiments, little or no dedicated graphics (parallel processing) memory would be provided, and PPU 202 would use system memory exclusively or almost exclusively. In UMA embodiments, a PPU 202 may be integrated into a bridge chip or processor chip or provided as a discrete chip with a high-speed link (e.g., PCIe) connecting the PPU 202 to system memory via a bridge chip or other communication means.

As noted above, any number of PPUs 202 can be included in a parallel processing subsystem 112. For instance, multiple PPUs 202 can be provided on a single add-in card, or multiple add-in cards can be connected to communication path 113, or one or more of PPUs 202 can be integrated into a bridge chip. PPUs 202 in a multi-PPU system may be identical to or different from one another. For instance, different PPUs 202 might have different numbers of processing cores, different amounts of local parallel processing memory, and so on. Where multiple PPUs 202 are present, those PPUs may be operated in parallel to process data at a higher throughput than is possible with a single PPU 202. Systems incorporating one or more PPUs 202 may be implemented in a variety of configurations and form factors, including desktop, laptop, or handheld personal computers, servers, workstations, game consoles, embedded systems, and the like.

Detecting Errors in Audio Data

Figure 3:
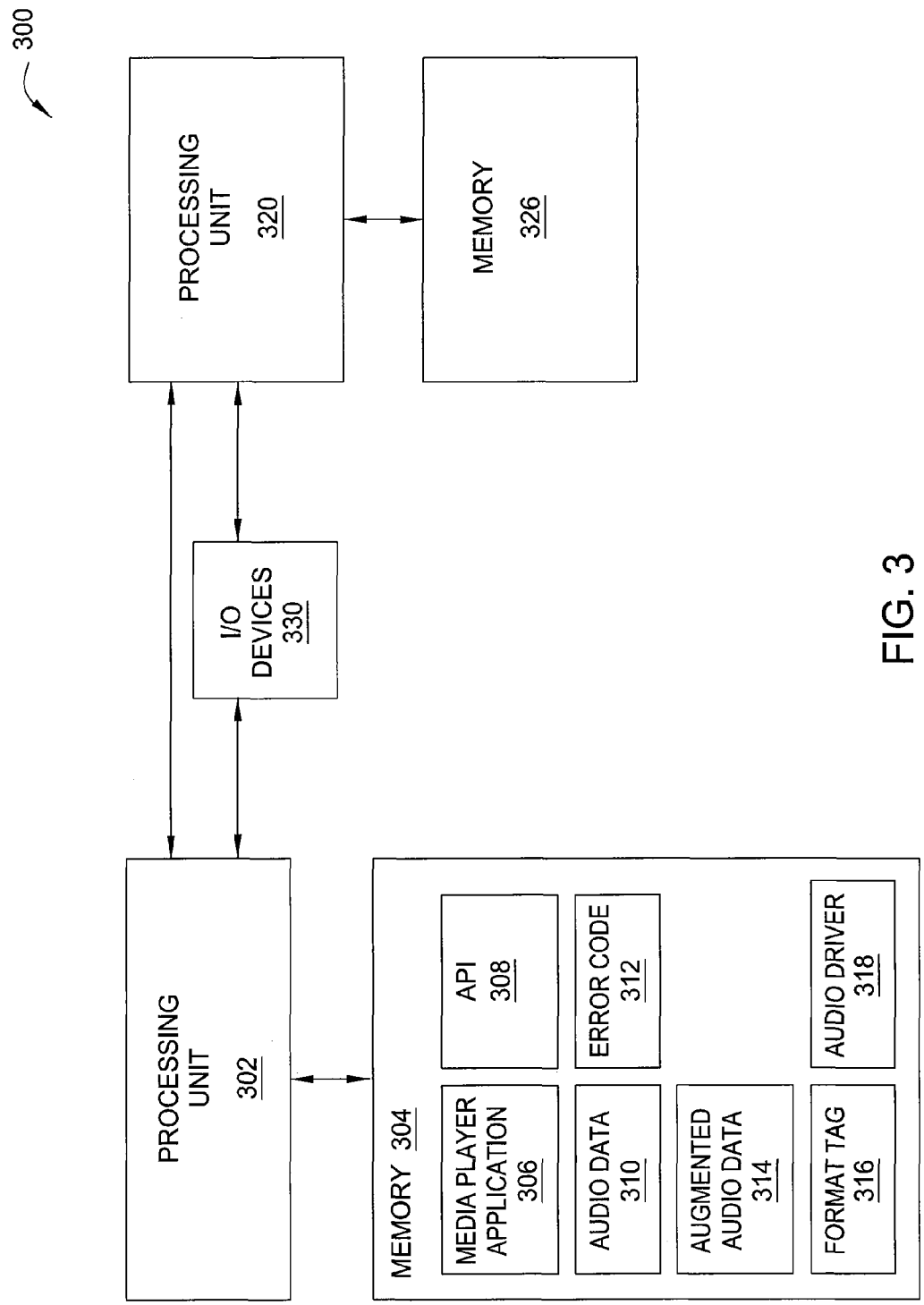
FIG. 3 is a block diagram that illustrates a processing unit configured to stream audio data to another processing unit, according to one embodiment of the present invention.

FIG. 3 is a block diagram 300 that illustrates a processing unit 302 configured to stream audio data to a processing unit 320, according to one embodiment of the present invention. As shown, processing unit 302 is coupled to processing unit 320 as well as to a memory 304 and to input/output (I/O) devices 330. Similarly, processing unit 320 is coupled to I/O devices 330 as well as to a memory 326 too.

Each of processing units 302 and 320 could be, e.g., a CPU, a GPU, a PPU, or any combination of devices capable of processing data. The different elements within FIG. 3, in various embodiments, could be stand-alone elements in a computer system or could be integrated within a system-on-a-chip (SoC). In one embodiment, processing unit 302 is implemented by parallel processing subsystem 112 (shown in FIG. 1) or PPU 202 (shown in FIG. 2) and processing unit 320 is implemented by CPU 102 (shown in FIG. 1). Processing units 302 and 320 may support a variety of different audio architectures, including, e.g., a High Definition Audio (HDA) architecture. In various embodiments, processing units 302 and 320 may included within a mobile device, such as a cell phone, a smart phone, a tablet computer, and the like, or within any type of larger computer system or network.

I/O devices 330 may include input devices, such as a keyboard, a mouse, a touchpad, a microphone, a video camera, and so forth, as well as output devices, such as a screen, a speaker, a printer, a projector, and so forth. In addition, I/O devices 330 may include devices capable of performing both input and output operations, such as a touch screen, an Ethernet port, a universal serial bus (USB) port, a serial port, etc. In one embodiment, I/O devices 330 are configured to output HDA.

Each of memories 304 and 326 may include a hard disk, one or more random access memory (RAM) modules, a database, one or more software and/or hardware registers, and so forth. In general, any technically feasible unit that is capable of storing data may implement either of memories 304 and 326.

As also shown in FIG. 3, memory 304 includes a media player application 306, an application programming interface (API) 308, audio data 310, error code 312, augmented audio data 314, a format tag 316, and an audio driver 318. Media player application 306 is a software application capable of causing data to be streamed to processing unit 320. For example, media player application 306 could be a Blu-Ray™ player application that reads data from a Blu-Ray™ disc and streams that data to processing unit 320. The data could be, among others, video data or audio data (such as audio data 310 or augmented audio data 314). Audio data 310 could be HDA data or another type of audio data made up of individual samples. As discussed herein, audio data 310 has a sample size of M bits per sample.

API 308 is a set of software routines that may be used by media player application 306 to manipulate audio data (such as, e.g., audio data 310), open audio data streams to processing unit 320, and perform various other tasks related to streaming audio data to processing unit 320. In one embodiment, API 310 is integrated into media player application 306.

When streaming audio data to processing unit 320, API 308 is configured to first perform an error checking procedure with audio data 310 to produce error code 312. Error code 312 includes a collection of N bit error code values, where each N bit error code value corresponds to a different M bit audio data sample within audio data 310. Error code 312 could be the results of a cyclic redundancy check (CRC), a counter value for each sample within audio data 310, or another type of error detection and/or correction code that produces an N bit value for each of the M bit samples within audio data 310. Those skilled in the art will understand that API 308 may implement any technically feasible type of error detection/correction code to generate the error code values within error code 312.

Upon generating error code 312, API 308 combines audio data 310 with error code 312 to produce augmented audio data 314. More specifically, API 308 combines each of the M bit samples within audio data 310 with a corresponding N bit value within error code 312 to produce a collection of M+N bit samples. Accordingly, M of the bits within a given M+N bit sample are derived from an M bit sample within audio data 310, and N of the bits within a given M+N bit sample are derived from a corresponding N bit value with error code 312. In one embodiment, API 308 also compresses and/or encrypts audio data 310 prior to combining audio data 310 with error code 312.

Once API 308 generates augmented audio data 314, API 308 selects a format tag 316 that indicates the format of augmented audio data 314. The format tag could indicate, for example, that each sample of augmented audio data 314 includes an M bit portion representing a sample of audio data and an N bit portion representing an error code value associated with that sample. In embodiments where API 308 compresses and/or encrypts audio data 310 prior to generating augmented audio data 314, API 308 selects a format tag that indicates the compression and/or encryption algorithm used to compress and/or encrypt audio data 310.

After augmented audio data 314 has been generated and API 308 has selected format tag 316, API 308 opens an audio data stream to processing unit 320. In general, when API 308 opens audio data streams, API 310 may open that stream by interacting with an operating system (not shown) executing on processing unit 302, and may open a given audio data stream with a particular number of channels, a particular sample size, and a particular sample rate. For example, API 310 could open an audio data stream with anywhere between 2 and 8 channels with 16 or 24 bit samples at an 192 kilohertz (kH) or 768 kH sampling rate. When augmented audio data 314 includes a collection of M+N bit samples, as discussed herein, API 308 is configured to open an M+N bit data stream to processing unit 320 (M bits to accommodate the audio data portion and N bits to accommodate the error code portion).

Once API 308 has opened an audio data stream having sufficient bandwidth to stream augmented audio data 314, API 308 passes augmented audio data 314 and format tag 316 to audio driver 318.

Audio driver 318 is a software application that may be executed by processing unit 302 to allow processing unit 302 to interact with audio hardware included within processing unit 320. In one embodiment, audio driver 318 is derived from device driver 103 shown in FIG. 1. After API 308 has opened an audio data stream to processing unit 320, audio driver 318 receives augmented audio data 314 and format tag 316 from API 308. Based on format tag 316, audio driver 318 transmits a signal to processing unit 320 that indicates the format of augmented audio data 314. Audio driver 318 may then stream augmented audio data 314 to processing unit 320 via the opened audio data stream, i.e. transmit individual M+N bit samples to processing unit 320.

In alternative embodiments, the functionality performed by processing unit 302, as described above, may be performed by any other type of hardware unit that is capable of generating augmented audio data using software applications included within memory 304. The hardware unit performing the functionality of processing unit 302 in this embodiment could be, e.g., a hard disk drive, a printed circuit board, or a video card, among other types of hardware devices.

As discussed in greater detail below in conjunction with FIG. 4, processing unit 320 is configured to receive augmented audio data 314, decode that data into an audio data component and an error code component, and then verify the integrity of the data component based on the error code component.

Figure 4:
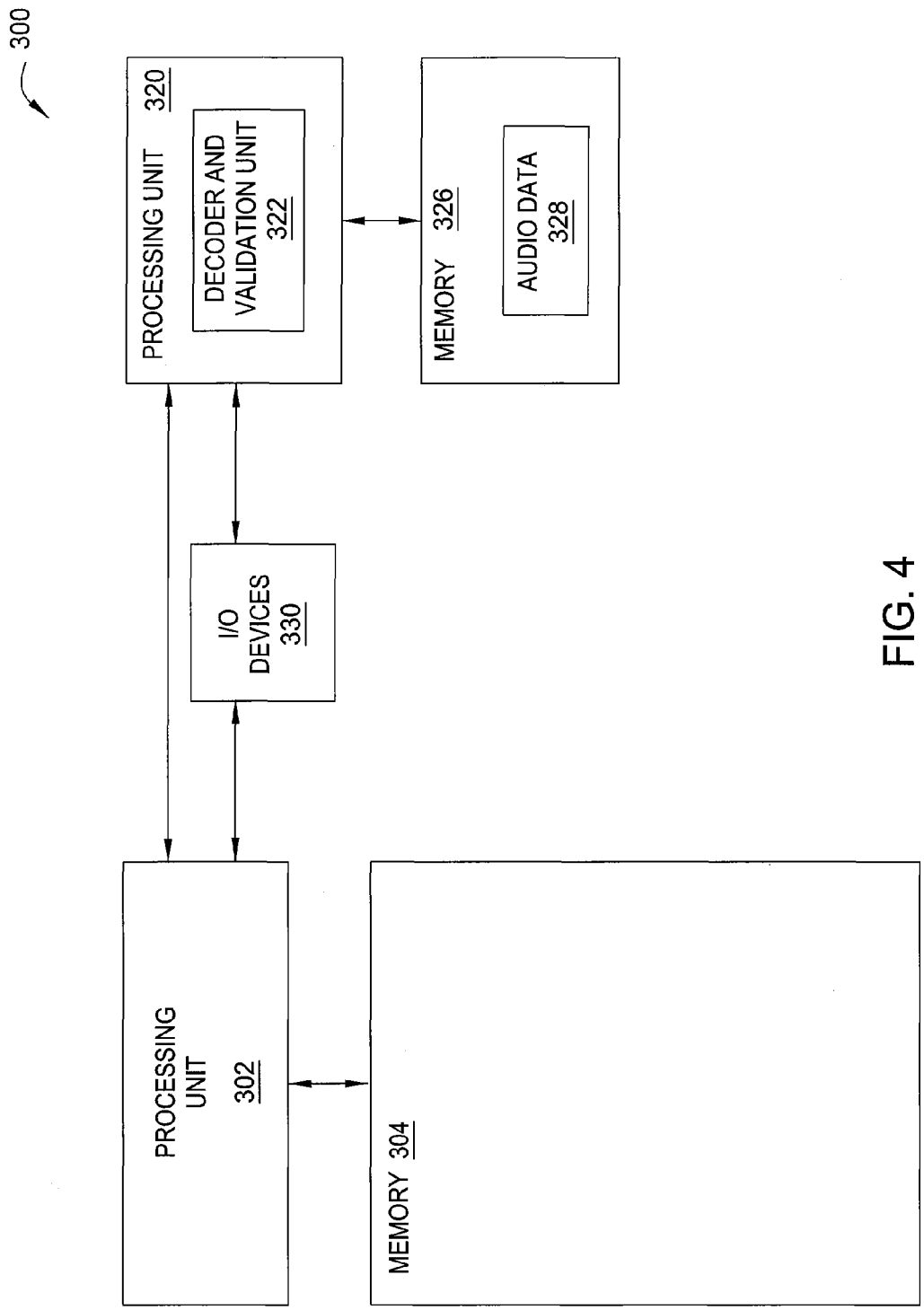
FIG. 4 illustrates the block diagram shown in FIG. 3 in greater detail, according to one embodiment of the present invention.

FIG. 4 illustrates block diagram 300 of FIG. 3 in greater detail, according to one embodiment of the present invention. Block diagram 300 includes some of the same components as shown in FIG. 4, and, additionally, certain components have been omitted for clarity. As shown, processing unit 320 includes decoder and validation unit 322. Memory 326 coupled to processing unit 320 includes audio data 328.

Decoder and validation unit 322 is a hardware element embedded within processing unit 320 and could be implemented by an application-specific integrated circuit (ASIC), an embedded processor, a collection of logic gates, or any other type of hardware element. Decoder and validation unit 322 is configured to receive from processing unit 302 a signal that indicates the format of augmented audio data 314 (shown in FIG. 3) as well as augmented audio data 314 itself. Based on the received signal, decoder and validation unit 322 is configured to decode augmented audio data 314 into separate audio and error code components, i.e. separate each received sample into an audio sample and an error code value.

As discussed above, augmented audio data 314 includes a collection of M+N bit samples, where each sample includes an M bit audio data sample and an N bit error code value. When decoder and validation unit 322 receives a given M+N bit sample, decoder and validation unit 322 decodes the received sample into an M bit audio sample and an N bit error code value based on the received signal indicating the format of that M+N bit sample. For example, when augmented audio data 314 includes 16+8 bit samples, then decoder and validation unit 322 could decode a given augmented audio data sample into a 16 bit audio data sample and an 8 bit error code value.

For a given M+N bit sample, decoder and validation unit 322 is configured to verify that the N bit error code value does not indicate any errors associated with the M bit audio data sample. If decoder and validation unit 322 does not detect any errors within the N bit error code value, decoder and validation unit 322 may store audio data 328 in memory 314 and/or cause I/O devices 330 to output sound derived from the corresponding M bit audio data sample.

Decoder and validation unit 322 may also buffer M bit audio data samples in memory 326 as audio data 328. Memory 326 could be, e.g., memory local to processing unit 320. When all of the M+N bit samples associated with augmented audio data 314 have been received and each M bit audio data sample has been written to audio data 328, audio data 328 may be nearly identical to audio data 310 shown in FIG. 3. In embodiments where the M bit audio data portion of augmented audio data 314 is compressed and/or encrypted, prior to being incorporated into augmented audio data 314, decoder and validation unit 322 decompresses and/or de-encrypts each M bit audio data sample prior to causing I/O devices 330 to output sound derived from that sample and/or storing that sample within audio data 328.

After decoding a given M+N bit sample of augmented audio data 314, if validation unit 324 detects errors within associated N bit error code value, then decoder and validation unit 322 may notify processing unit 302 that the augmented audio data 314 being streamed to processing unit 320 includes compromised data and that processing unit 302 should regenerate and resend augmented audio data. In situations where decoder and validation unit 322 identifies NULL values appended to augmented audio data 314, decoder and validation unit 322 may forgo notifying processing unit 302 and simply output sound derived from those NULL values. Additionally, decoder and validation unit 322 may also terminate any sound output by I/O devices 330 derived from augmented audio data 314. Through this technique, decoder and validation unit 322 is capable of preserving the user's experience by preventing sound derived from compromised audio data from being output to the user.

In one embodiment, the functionality of processing unit 320 may be performed by any type of hardware unit that includes decoder and validation unit 322 and is capable of causing I/O devices 330 to output sound derived from decoded audio data.

Persons skilled in the art will recognize that the techniques described herein, although directed towards audio data and audio data processing, are equally applicable to other types of data and data processing. For example, API 308 could generate error code values for video data and combine those error code values with the video data to be streamed to processing unit 320. Then, decoder and validation unit 322 could decode and validate the received data before rendering the video data to a display device. Additionally, the techniques described herein could also be applied to embedding error code data into additional channels of data or additional samples of data. For example, data with a given number of channels could be augmented with error code data embedded within one or more additional channels, or data with a given sample rate could be augmented with error code data embedded within extra samples made available by increasing the sample rate of the data.

Figure 5:
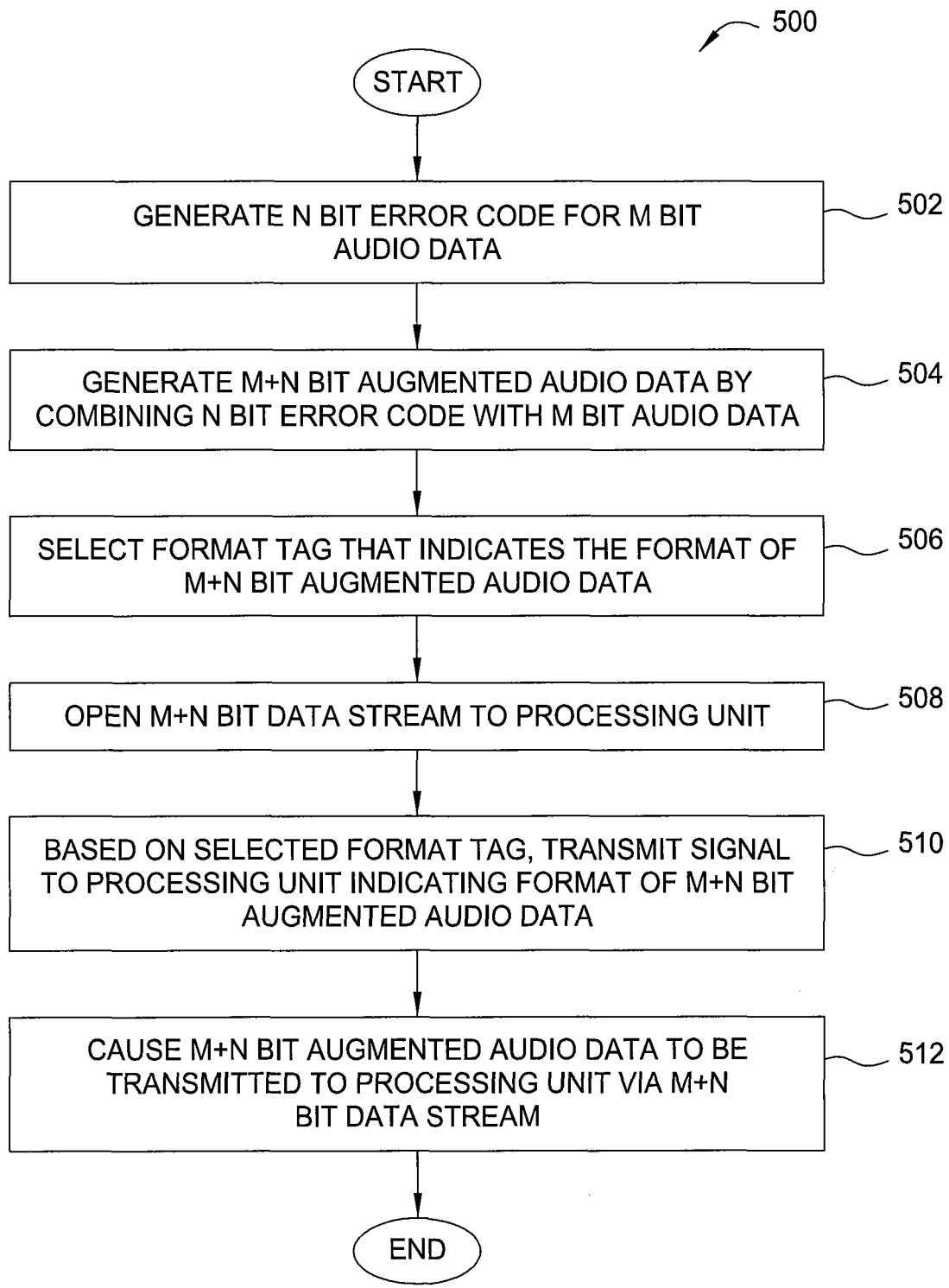
FIG. 5 is a flowchart of method steps for generating augmented audio data by combining audio data with an error code, according to one embodiment of the present invention.

FIG. 5 is a flowchart of method steps for generating augmented audio data 314 by combining audio data 310 with error code 312, according to one embodiment of the present invention. Although the method 500 is described in conjunction with the systems of FIGS. 1-4, persons skilled in the art will understand that any system configured to perform the method steps, in any order, is within the scope of the present invention. In one embodiment, API 308 and audio driver 318, shown in FIG. 3, cooperate to perform the method 500.

As shown, the method 500 begins at step 502, where API 308 generates an N bit error code for M bit audio data. The N bit error code could be, e.g., error code 312, while the M bit audio data could be, e.g., audio data 310. The N bit error code could represent, for example, the results of a CRC, a counter value for each sample within the M bit audio data, or another type of error detection and/or correction code that produces an N bit value for each of the M bit samples within the M bit audio data. Those skilled in the art will understand that API 308 may implement any technically feasible type of error detection/correction code to generate the N bit error code.

At step 504, API 308 generates M+N bit augmented audio data by combining the M bit audio data with the N bit error code. More specifically, API 308 combines each of the M bit samples within the M bit audio data with a corresponding N bit value within the N bit error code to produce a collection of M+N bit samples. In one embodiment, API 308 also compresses and/or encrypts the M bit audio data prior to combining that data with the N bit error code.

At step 506, API 308 selects a format tag that indicates the format of the M+N bit augmented audio data generated at step 504. The format tag may indicate, for example, the different values of M and N as well as compression and/or encryption information related to the M bit audio data.

At step 508, API 308 opens an M+N bit data stream to processing unit 320. The M+N bit data stream is capable of streaming a collection of M+N bit samples, such as those included in the M+N bit augmented audio data, to processing unit 320. In one embodiment, API 308 interacts with an OS executing on processing unit 302 to open the M+N bit data stream.

At step 510, audio driver 318 receives the M+N bit augmented audio data and the selected format tag and transmits a signal to processing unit 320 that indicates the format of the M+N bit augmented audio data. At step 512, audio driver 318 causes the M+N bit augmented audio data to be transmitted to processing unit 320 via the M+N bit data stream opened at step 508, i.e. audio driver 318 transmits individual M+N bit samples to processing unit 320. The method 500 then ends.

Figure 6:
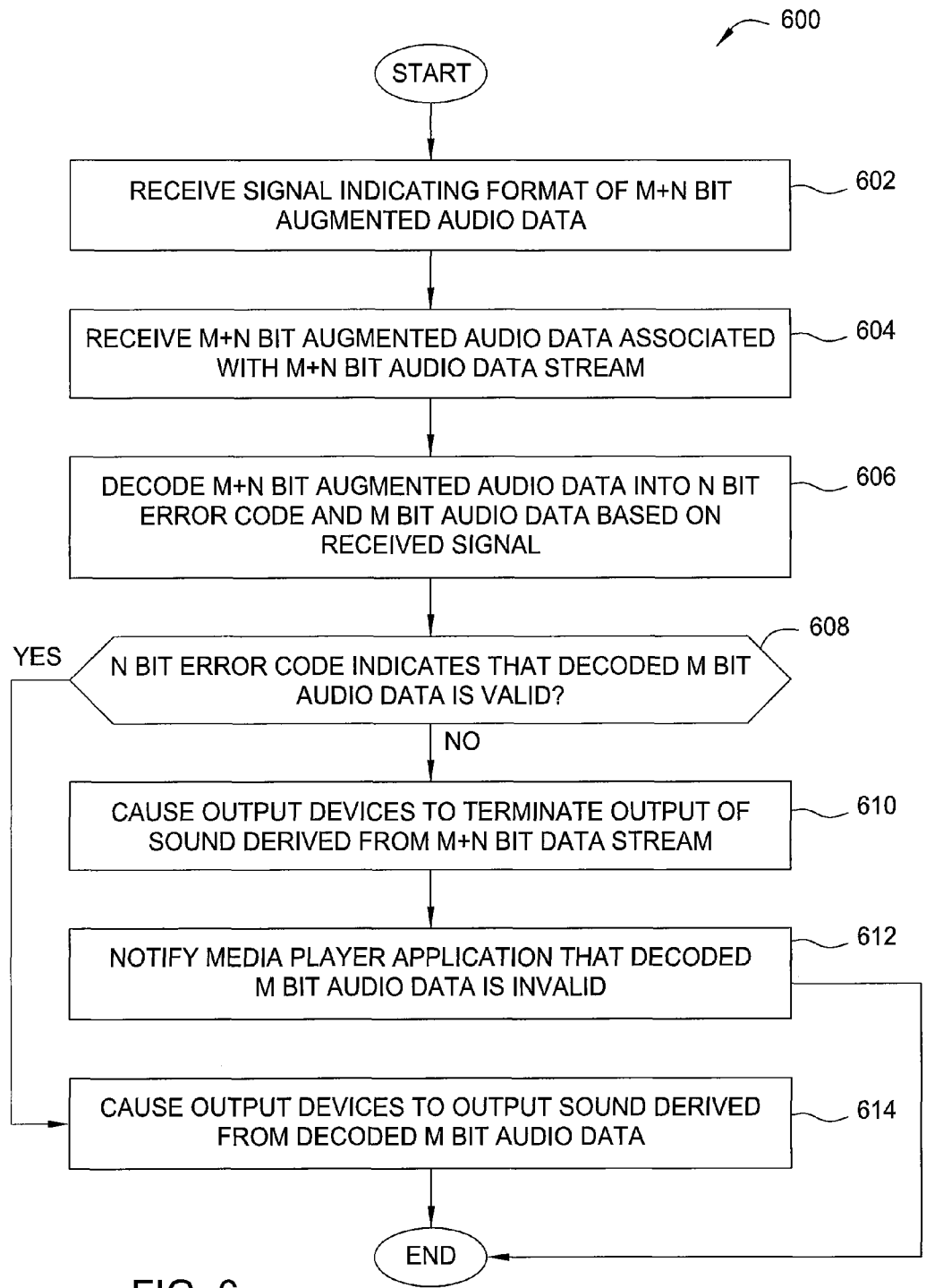
FIG. 6 is a flowchart of method steps for decoding augmented audio data, according to one embodiment of the present invention.

FIG. 6 is a flowchart of method steps for decoding augmented audio data, according to one embodiment of the present invention. Although the method steps are described in conjunction with the systems of FIGS. 1-4, persons skilled in the art will understand that any system configured to perform the method steps, in any order, is within the scope of the present invention. In one embodiment, decoder and validation unit 322, shown in FIG. 4, performs the method 600.

As shown, the method 600 begins at step 602, where decoder and validation unit 322 within processing unit 320 receives a signal from processing unit audio driver 318 within processing unit 302 indicating the format of M+N bit augmented audio data that is to be received by processing unit 320.

At step 604, decoder and validation unit 322 receives M+N bit audio data from processing unit 320 that is associated with an M+N bit audio data stream. Decoder and validation unit 322 could, for example, receive one or more M+N bit samples associated with augmented audio data 314 shown in FIG. 3.

At step 606, decoder and validation unit 322 decodes the M+N bit augmented audio data into N bit error code values and M bit audio data samples based on the format indicated by the received signal. For example, decoder and validation unit 322 could decode a single 24 bit sample into a 16 bit audio data sample and an 8 bit error code value.

At step 608, decoder and validation unit 322 determines whether the N bit error code data indicates that the decoded M bit audio data is valid. If decoder and validation unit 322 determines that the decoded M bit audio data is not valid, then the method 600 proceeds to step 610, where decoder and validation unit 322 causes output devices (such as I/O devices 318) currently outputting sound associated with the M+N bit audio data stream to terminate the output of sound derived from that M+N bit audio data stream. In one embodiment, decoder and validation unit 322 simply causes output devices to output silent audio samples. At step 612, decoder and validation unit 322 notifies media player 306 (shown in FIG. 1) that the received M bit audio data was compromised. As mentioned above in conjunction with FIG. 4, media player application 306 may then regenerate and resend augmented audio data to decoder and validation unit 322.

At step 608, if decoder and validation unit 322 determines that the decoded M bit audio data is valid, then the method 600 proceeds to step 614, where processing unit 320 causes output devices within I/O devices 330 to output sound derived from the decoded M bit audio data. The method 600 then ends.

Persons skilled in the art will recognize that the method 600 may be repeated for each M+N bit sample of augmented audio data received from processing unit 302 via an M+N bit audio data stream. When processing unit 302 streams augmented audio data in the form of individual M+N bit samples, the method 600 may be implemented to identify errors within a single sample, thereby allowing processing unit 320 to terminate the audio data stream before sound derived from that compromised audio data is output to a user.

In sum, an application programming interface (API) executed by a first processing unit combines audio data samples with error code values generated for those samples. The API then causes a data stream to be opened having sufficient bandwidth to accommodate combined samples made up of audio data samples and corresponding error code values. The combined samples are then transmitted to a decoder and validation unit within a second processing unit that receives the combined data, strips the error code values and validates the audio data based on the error code values. When the error code values indicate that the audio data has been compromised, the second processing unit terminates the audio output (i.e., the sound) derived from the audio data.

Advantageously, when audio hardware receives compromised audio data, the audio hardware is capable of determining that the audio data has been compromised and is able to immediately stop outputting sound derived from the compromised audio data. Accordingly, the audio hardware preserves the user experience by ensuring that unintelligible or unpleasant sounds caused by compromised audio data are not output to the user.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A computer-implemented method for embedding error code values into data samples streamed from a first hardware unit to a second hardware unit, the method comprising:
   receiving an M bit data sample from a software application executing on the first hardware unit, M being an integer;
   generating an N bit error code value by performing an error analysis on the M bit data sample, N being an integer;
   generating an M+N bit augmented data sample by combining the M bit data sample with the N bit error code value; and
   generating an M+N bit data stream for the second hardware unit, wherein the second hardware unit is configured to receive the M+N bit augmented data sample via the M+N bit data stream, reproduce the M bit data sample and the N bit error code value based on the M+N bit augmented data sample, identify errors in the M bit data sample based on the N bit error code value, and terminate output of the M bit data sample when one or more errors in the M bit data sample are identified.

2. The computer-implemented method of claim 1, further comprising:
   selecting a format tag that indicates a format associated with the M+N bit augmented data sample; and
   transmitting the format tag to a driver application configured to notify the second hardware unit of the format associated with the M+N bit augmented data sample based on the format tag.

3. The computer-implemented method of claim 1, wherein generating the M+N bit augmented data sample comprises compressing and/or encrypting the M bit data sample prior to combining the M bit data sample with the N bit error code value.

4. The computer-implemented method of claim 1, wherein the error analysis performed on the M bit data sample comprises a cyclic redundancy check (CRC) or error-correcting code (ECC) operation.

5. The computer-implemented method of claim 1, wherein the software application comprises a Blu-Ray™ player application.

6. The computer-implemented method of claim 1, wherein the first hardware unit comprises a central processing unit (CPU), the second hardware unit comprises a graphics processing unit (GPU), and the first and second hardware units are both compatible with a High Definition Audio (HDA) architecture.

7. The computer-implemented method of claim 1, wherein the M+N bit data sample comprises an audio data sample or a video data sample.

8. A non-transitory computer-readable medium storing program instructions that, when executed by a processing unit, cause the processing unit to embed error code values into data samples streamed from a first hardware unit to a second hardware unit by performing the steps of:
  receiving an M bit data sample from a software application executing on the first hardware unit, M being an integer;
  generating an N bit error code value by performing an error analysis on the M bit data sample, N being an integer;
  generating an M+N bit augmented data sample by combining the M bit data sample with the N bit error code value; and
  generating an M+N bit data stream for the second hardware unit, wherein the second hardware unit is configured to receive the M+N bit augmented data sample via the M+N bit data stream, reproduce the M bit data sample and the N bit error code value based on the M+N bit augmented data sample, identify errors in the M bit data sample based on the N bit error code value, and terminate output of the M bit data sample when one or more errors in the M bit data sample are identified.

9. The non-transitory computer-readable medium of claim 8, further comprising the steps of:
  selecting a format tag that indicates a format associated with the M+N bit augmented data sample; and
  transmitting the format tag to a driver application configured to notify the second hardware unit of the format associated with the M+N bit augmented data sample based on the format tag.

10. The non-transitory computer-readable medium of claim 8, wherein the step of generating the M+N bit augmented data sample comprises compressing and/or encrypting the M bit data sample prior to combining the M bit data sample with the N bit error code value.

11. The non-transitory computer-readable medium of claim 8, wherein the error analysis performed on the M bit data sample comprises a cyclic redundancy check (CRC) or error-correcting code (ECC) operation.

12. The non-transitory computer-readable medium of claim 8, wherein the software application comprises a Blu-Ray™ player application.

13. The non-transitory computer-readable medium of claim 8, wherein the first hardware unit comprises a central processing unit (CPU), the second hardware unit comprises a graphics processing unit (GPU), and the first and second hardware units are both compatible with a High Definition Audio (HDA) architecture.

14. The non-transitory computer-readable medium of claim 8, wherein the M+N bit data sample comprises an audio data sample or a video data sample.

15. A computing device configured to embed error code values into data samples streamed from the computing device to a hardware unit, including:
  a processing unit configured to:
    receive an M bit data sample from a software application executing on the processing unit, M being an integer;
    generate an N bit error code value by performing an error analysis on the M bit data sample, N being an integer;
    generate an M+N bit augmented data sample by combining the M bit data sample with the N bit error code value; and
    generate an M+N bit data stream for the hardware unit, wherein the hardware unit is configured to receive the M+N bit augmented data sample via the M+N bit data stream, reproduce the M bit data sample and the N bit error code value based on the M+N bit augmented data sample, identify errors in the M bit data sample based on the N bit error code value, and terminate output of the M bit data sample when one or more errors in the M bit data sample are identified.

16. The computing device of claim 15, further including:
  a memory unit coupled to the processing unit and storing program instructions that, when executed by the processing unit, cause the processing unit to:
  receive the M bit data sample;
  generate the N bit error code value;
  generate the M+N bit augmented data sample; and
  open the M+N bit data stream to the hardware unit.

17. The computing device of claim 15, wherein the processing unit is further configured to:
  select a format tag that indicates a format associated with the M+N bit augmented data sample; and
  transmit the format tag to a driver application configured to notify the second hardware unit of the format associated with the M+N bit augmented data sample based on the format tag.

18. The computing device of claim 15, wherein the processing unit generates the M+N bit augmented data sample by compressing and/or encrypting the M bit data sample prior to combining the M bit data sample with the N bit error code value.

19. The computing device of claim 15, wherein the error analysis performed on the M bit data sample comprises a cyclic redundancy check (CRC) or error-correcting code (ECC) operation, the software application comprises a Blu-Ray™ player application, and the M bit data sample comprises an audio data sample or a video data sample.

20. The computing device of claim 15, wherein the processing unit comprises a central processing unit (CPU), the hardware unit comprises a graphics processing unit (GPU), and the processing unit and the hardware unit are both compatible with a High Definition Audio (HDA) architecture.

* * * * *